(12) United States Patent
Sawasaki et al.

(10) Patent No.: US 6,924,155 B2
(45) Date of Patent: *Aug. 2, 2005

(54) FERROELECTRIC MEMORY, METHOD OF FABRICATING THE SAME, SEMICONDUCTOR DEVICE, AND METHOD OF FABRICATING THE SAME

(75) Inventors: Tatsuo Sawasaki, Fujimi-machi (JP); Eiji Natori, Chino (JP); Tomokazu Kobayashi, Suwa (JP); Yasuaki Hamada, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 8 days.

This patent is subject to a terminal disclaimer.

(21) Appl. No.: 10/638,343

(22) Filed: Aug. 12, 2003

(65) Prior Publication Data

US 2004/0152213 A1 Aug. 5, 2004

(30) Foreign Application Priority Data

Aug. 14, 2002 (JP) ........................................ 2002-236568

(51) Int. Cl.⁷ .............................................. H01L 21/00
(52) U.S. Cl. ........................... 438/3; 438/257; 438/258; 438/593
(58) Field of Search ............................ 438/3, 257, 240, 438/310, 799; 257/295–310

(56) References Cited

U.S. PATENT DOCUMENTS

| 5,348,775 A | 9/1994 | Lin |
| 5,990,507 A | 11/1999 | Mochizuki et al. |
| 6,333,202 B1 * | 12/2001 | Adkisson et al. ............... 438/3 |
| 2002/0036934 A1 | 3/2002 | Hasegawa et al. |

FOREIGN PATENT DOCUMENTS

| JP | A 7-320539 | 12/1995 |
| JP | A 11-297947 | 10/1999 |
| JP | A 2000-91531 | 3/2000 |
| JP | A 2000-144419 | 5/2000 |
| JP | A 2002-57301 | 2/2002 |
| JP | A 2002-94020 | 3/2002 |

OTHER PUBLICATIONS

U.S. Appl. No. 10/397,431, filed Mar. 27, 2003, Sawasaki.
U.S. Appl. No. 10/397,315, filed Mar. 27, 2003, Sawasaki.

* cited by examiner

*Primary Examiner*—Dung A. Le
(74) *Attorney, Agent, or Firm*—Oliff & Berridge, PLC

(57) ABSTRACT

A method of manufacturing a ferroelectric memory of the present invention includes applying pulsed laser light 70 to a ferroelectric capacitor 105 from above the ferroelectric capacitor in a state in which at least the ferroelectric capacitor 105 is formed over a substrate 10.

12 Claims, 16 Drawing Sheets

FERROELECTRIC MEMORY, METHOD OF FABRICATING THE SAME, SEMICONDUCTOR DEVICE, AND METHOD OF FABRICATING THE SAME

Japanese Patent Application No. 2002-236568 filed on Aug. 14, 2002, is hereby incorporated by reference in its entirety.

BACKGROUND OF THE INVENTION

The present invention relates to a ferroelectric memory, a semiconductor device, a method of manufacturing a ferroelectric memory, and a method of manufacturing a semiconductor device.

A ferroelectric memory (FeRAM) retains data by spontaneous polarization of a ferroelectric capacitor using a ferroelectric thin film. In recent years, a semiconductor device using such a ferroelectric memory has attracted attention.

In the field of ferroelectric memory, one factor which determines characteristics of the device is the crystallization state of the ferroelectric thin film included in the ferroelectric capacitor. The manufacturing steps of the ferroelectric memory include a step of forming an interlayer dielectric or a protective film, in which a process which causes a large amount of hydrogen to be generated is used. Since the ferroelectric thin film is formed by using a ferroelectric which is generally formed of an oxide, the oxide may be reduced by hydrogen generated during the manufacturing step and adversely affect the characteristics of the ferroelectric capacitor.

As a method for improving the characteristics of the ferroelectric capacitor affected by hydrogen, a method of recovering the crystallization state of the ferroelectric thin film by using a high-temperature heat treatment using an electric kiln or the like can be given. However, this method may affect the characteristics of peripheral members such as metal interconnects in a state in which an interlayer dielectric or a protective film is formed due to atom diffusion or the like. In the case of integrating other semiconductor devices such as transistors in the ferroelectric memory, characteristics of the transistors may be adversely affected due to a thermal load applied during the high-temperature heat treatment. Therefore, a technology capable of recovering the characteristics of the ferroelectric capacitor while reducing the thermal load applied to the device has been demanded.

BRIEF SUMMARY OF THE INVENTION

The present invention may provide a method of manufacturing a ferroelectric memory capable of reducing a thermal load applied when recovering a characteristic of the ferroelectric capacitor, and a ferroelectric memory manufactured by using this manufacturing method. The present invention may also provide a semiconductor device including the ferroelectric memory of the present invention, and a method of manufacturing the same.

A method of manufacturing a ferroelectric memory according to one aspect of the present invention includes applying pulsed laser light or lamp light to a ferroelectric capacitor from above the ferroelectric capacitor in a state in which at least the ferroelectric capacitor is formed over a substrate.

Figure 1A:
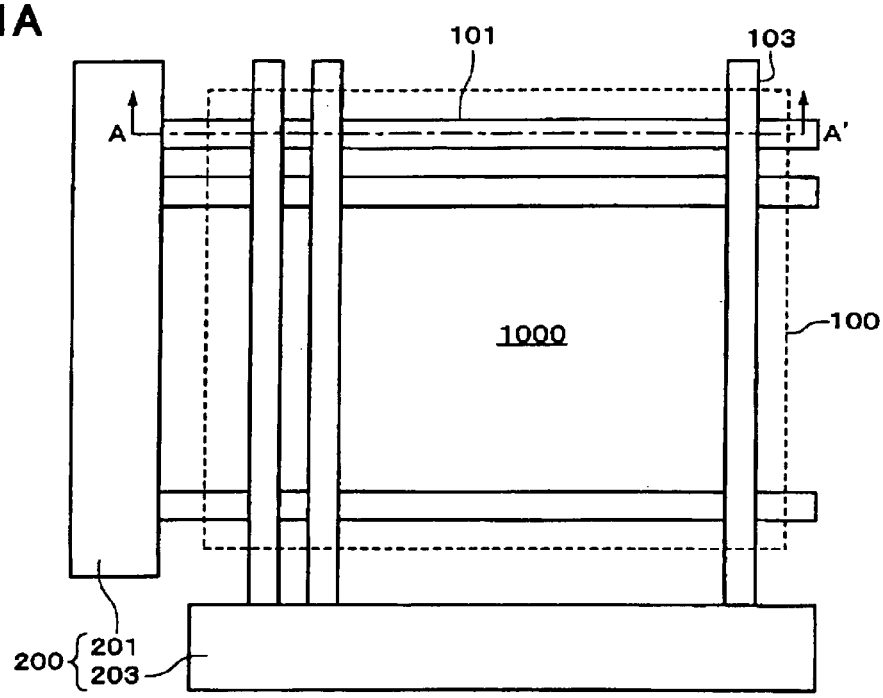
FIG. 1A is a plan view schematically showing a ferroelectric memory according to a first embodiment of the present invention.

DETAILED DESCRIPTION OF THE EMBODIMENT (1) A method of manufacturing a ferroelectric memory according to one embodiment of the present invention includes applying pulsed laser light or lamp light to a ferroelectric capacitor from above the ferroelectric capacitor in a state in which at least the ferroelectric capacitor is formed over a substrate.

In this method of manufacturing a ferroelectric memory, the pulsed laser light or lamp light is applied to the ferroelectric capacitor formed over the substrate from above the ferroelectric capacitor, and a characteristic of the ferroelectric capacitor can be improved by using thermal energy of the laser light or lamp light. In more detail, the crystallization state of the ferroelectric layer included in the ferroelectric capacitor changes, whereby a characteristic of the ferroelectric capacitor is recovered. Moreover, since the pulsed laser light or lamp light enables heating in a short period of time, a thermal load applied to an area in which light is not applied, such as peripheral members including metal interconnects, or transistors, can be reduced. Therefore, this method of manufacturing a ferroelectric memory enables a ferroelectric memory having excellent characteristics to be obtained while reducing a thermal load applied when recovering a characteristic of the ferroelectric capacitor.

The term "over . . . " used herein includes the case where something is formed over something else through a predetermined layer. The term "pulsed" used herein refers to a state in which laser light or lamp light is applied a plurality of times at predetermined intervals. The interval may be either constant or irregular.

(2) A method of manufacturing a ferroelectric memory according to another embodiment of the present invention includes: forming a light blocking film having an opening over at least a predetermined area of a ferroelectric layer included in a ferroelectric capacitor in a state in which at least the ferroelectric capacitor is formed over a substrate; and applying pulsed laser light or lamp light to the ferroelectric capacitor from above the ferroelectric capacitor.

This method of manufacturing a ferroelectric memory differs from the above manufacturing method (1) in that the light blocking film having an opening over a predetermined area of the ferroelectric layer included in the ferroelectric capacitor is formed. The light blocking film blocks a thermal load applied to the portion under the light blocking film by absorbing or reflecting the applied pulsed laser light or lamp light. The "predetermined area of the ferroelectric layer" used herein refers to an area which includes a part or all of the formed ferroelectric layer and substantially functions as at least a constituent element of the ferroelectric capacitor.

In this method of manufacturing a ferroelectric memory, when the laser light or lamp light is applied, thermal energy of the laser light or lamp light can be applied to only the predetermined area of the ferroelectric layer through the opening of the light blocking film. Therefore, according to this method of manufacturing a ferroelectric memory, a ferroelectric memory having excellent characteristics can be obtained while sufficiently reducing a thermal load applied to the peripheral members and the like.

This method of manufacturing a ferroelectric memory may have any of the following features.

(A) The method may include applying the pulsed laser light or lamp light to a ferroelectric layer included in the ferroelectric capacitor to recover a characteristic of the ferroelectric capacitor.

(B) The method may include applying the pulsed laser light or lamp light after forming an interlayer dielectric over the ferroelectric capacitor. According to this feature, a characteristic of the ferroelectric capacitor affected by the reduction of hydrogen generated during the formation step of the interlayer dielectric can be improved while reducing a thermal load applied to the peripheral members.

(C) The method may include applying the pulsed laser light or lamp light after forming a metal interconnect for connecting the ferroelectric capacitor with another section. According to this feature, a characteristic of the ferroelectric capacitor can be improved while reducing a thermal load applied to the metal interconnect of which a characteristic easily deteriorate due to thermal load.

(D) The method may include applying the pulsed laser light or lamp light after forming a protective film which covers a metal interconnect for connecting the ferroelectric capacitor with another section. According to this feature, a characteristic of the ferroelectric capacitor affected by the reduction of hydrogen generated during the formation step of the protective film can be improved while reducing the thermal load applied to the peripheral members.

(E) The method may include forming an upper electrode included in the ferroelectric capacitor by using a material which transmits or absorbs light. According to this feature, thermal energy of the laser light or lamp light can be efficiently applied to the ferroelectric layer through the upper electrode, whereby a characteristic of the ferroelectric capacitor can be improved in a short period of time.

(F) The method may include forming a lower electrode included in the ferroelectric capacitor by using a material which reflects light. According to this feature, thermal energy can be efficiently applied to the ferroelectric layer by allowing the lower electrode to reflect the irradiated laser light or lamp light, whereby a characteristic of the ferroelectric capacitor can be improved in a short period of time.

(3) A ferroelectric memory according to a further embodiment of the present invention is manufactured by using any one of the above manufacturing methods. The ferroelectric memory according to a still further embodiment of the present invention includes a ferroelectric capacitor which has: stripe-shaped upper electrodes and stripe-shaped lower electrodes, the upper and lower electrodes being formed to intersect each other over a substrate; and a ferroelectric layer formed between the upper electrodes and the lower electrodes and disposed in at least one of intersecting regions of the upper electrodes and the lower electrodes.

(4) A method of manufacturing a semiconductor device according to an even further embodiment of the present invention is a method of manufacturing a semiconductor device which includes a memory cell region and another circuit region, the memory cell region having a ferroelectric capacitor, the method including: forming the memory cell region in a predetermined region over a substrate; and forming the circuit region over the substrate in a region differing from the memory cell region, wherein a light blocking film is formed over the circuit region when forming the circuit region, and wherein the memory cell region is formed by using any one of the above manufacturing methods after forming at least the light blocking film.

According to this method of manufacturing a semiconductor device, since a thermal load applied to the circuit region other than the memory cell region can be reduced by the light blocking film, the degrees of freedom of the manufacturing process are increased. According to this manufacturing method, since the amount of thermal load applied to the circuit region is small, metal interconnects and the like do not deteriorate due to heat used for crystallization, whereby a characteristic and the yield of the manufactured device can be secured sufficiently.

(5) A semiconductor device according to a yet further embodiment of the present invention is manufactured by using the above manufacturing method.

Embodiments of the present invention are described below in detail with reference to the drawings.

First Embodiment

Figure 1B:
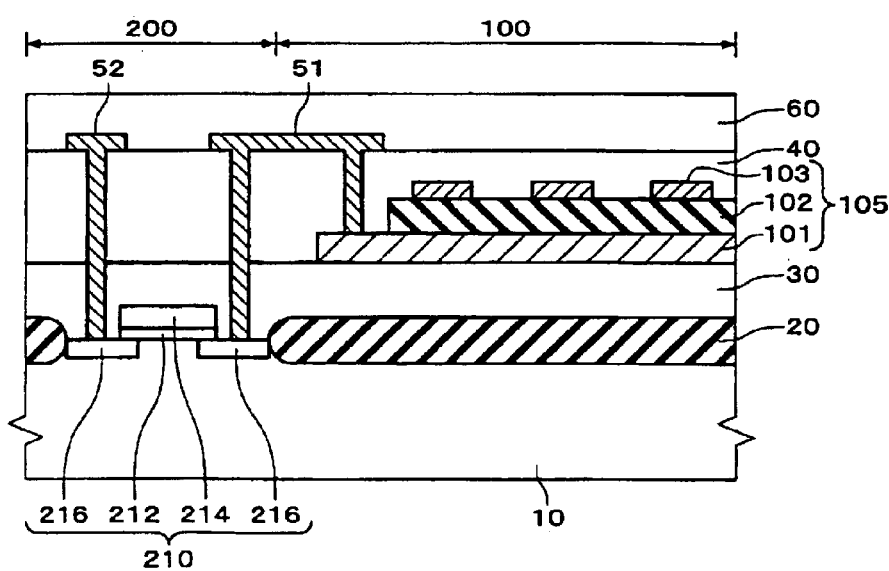
FIG. 1B is a cross-sectional view along the line A—A' shown in FIG. 1A.

FIGS. 1A and 1B schematically show a ferroelectric memory 1000 according to a first embodiment of the present invention. FIG. 1A shows a planar shape of the ferroelectric memory 1000 according to the present embodiment. FIG. 1B shows a cross section along the line A—A' shown in FIG. 1A.

As shown in FIG. 1A, the ferroelectric memory 1000 according to the present embodiment includes a memory cell array 100 and a peripheral circuit section 200. The memory cell array 100 and the peripheral circuit section 200 are formed in different layers. The peripheral circuit section 200 is disposed over a semiconductor substrate 10 in a region differing from the memory cell array 100. As specific examples of the peripheral circuit section 200, a Y gate, sense amplifier, input-output buffer, X address decoder, Y address decoder, or address buffer can be given.

In the memory cell array 100, lower electrodes 101 (word lines) for selecting rows and upper electrodes 103 (bit lines) for selecting columns are arranged to intersect. The lower electrodes 101 and the upper electrodes 103 are in the shape of stripes formed of a plurality of linear signal electrodes. The signal electrodes may be formed so that the lower electrodes 101 are bit lines and the upper electrodes 103 are word lines.

As shown in FIG. 1B, a ferroelectric layer 102 is disposed between the lower electrode 101 and the upper electrode 103. In the memory cell array 100, a memory cell which functions as a ferroelectric capacitor 105 is formed in a region in which the lower electrode 101 intersects the upper electrode 103. It suffices that the ferroelectric layer 102 be disposed at least in the region in which the lower electrode 101 intersects the upper electrode 103.

In the ferroelectric memory 1000 according to the present embodiment, a second interlayer dielectric 40 is formed to cover the lower electrodes 101, the ferroelectric layer 102, and the upper electrodes 103. An insulating protective layer 60 is formed over the second interlayer dielectric 40 so as to cover interconnect layers 51 and 52.

As shown in FIG. 1A, the peripheral circuit section 200 includes various circuits for selectively writing data in or reading data from the memory cell 100. The peripheral circuit section 200 includes a first driver circuit 201 for selectively controlling the lower electrodes 101, a second driver circuit 203 for selectively controlling the upper electrodes 103, and a signal detection circuit (not shown) such as a sense amplifier, for example.

As shown in FIG. 1B, the peripheral circuit section 200 includes a MOS transistor 210 formed over the semiconductor substrate 10. The MOS transistor 210 includes a gate insulating film 212, a gate electrode 214, and source/drain regions 216. The MOS transistors 210 are isolated from one another by an element isolation region 20. A first interlayer dielectric 30 is formed over the semiconductor substrate 110 on which the MOS transistor 210 is formed. The peripheral circuit section 200 is electrically connected with the memory cell array 100 through the interconnect layer 51.

An example of a write and read operation of the ferroelectric memory 1000 according to the present embodiment is described below.

In the read operation, a read voltage is applied to the capacitor of the selected memory cell. This also serves as a write operation of "0". The sense amplifier reads a current flowing through the selected bit line or a potential when causing the bit line to be in a high impedance state. A predetermined voltage is applied to the capacitors of the non-selected memory cells in order to prevent occurrence of crosstalk during reading.

In the write operation, in the case of writing "1", a write voltage which causes the polarization state to be inverted is applied to the capacitor of the selected memory cell. In the case of writing data "0", a write voltage which does not cause the polarization state to be inverted is applied to the capacitor of the selected memory cell, whereby the "0" state written during the read operation is retained. A predetermined voltage is applied to the capacitors of the non-selected memory cells in order to prevent occurrence of crosstalk during writing.

A method of manufacturing the ferroelectric memory 1000 according to the present embodiment is described below with reference to FIGS. 2 to 6.

In the method of manufacturing the ferroelectric memory 1000 according to the present embodiment, the memory cell 100 and the peripheral circuit section 200 are formed over the semiconductor substrate 10. The formation steps of the second interlayer dielectric 40, the interconnect layers 51 and 52, and the protective film 60 shown in FIGS. 3 to 6 are then performed while improving characteristics of the ferroelectric capacitor 105 by using irradiation devices shown in FIGS. 2A and 2B.

Figure 2A:
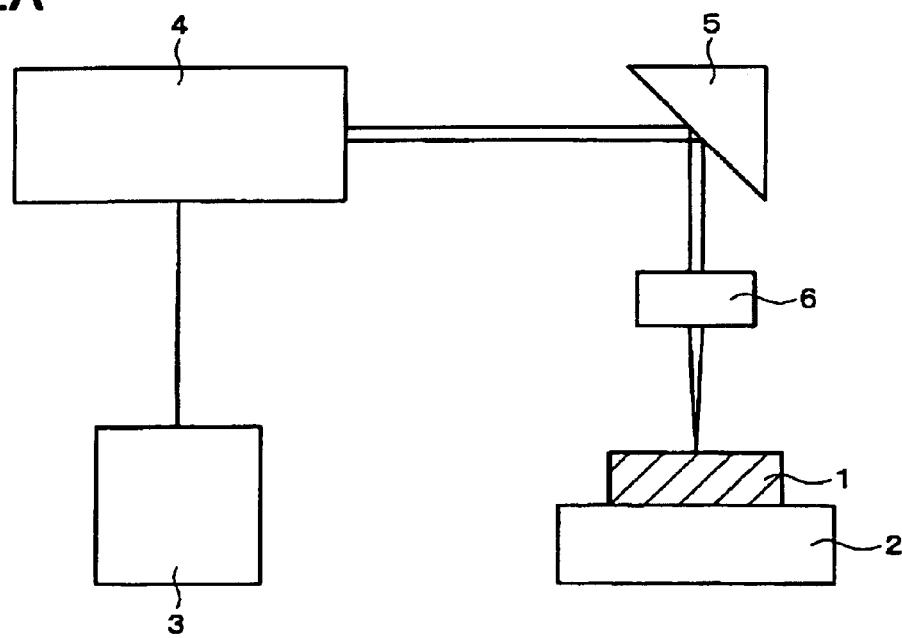
FIG. 2A schematically shows a laser irradiation device used in a manufacturing step of the ferroelectric memory according to the first embodiment of the present invention, and FIG. 2B schematically shows a lamp irradiation device used in a manufacturing step of the ferroelectric memory according to the first embodiment of the present invention.

FIG. 2A schematically shows an example of a laser irradiation device. In this laser irradiation device, laser light output from a laser (excimer laser, for example) 4 which can output light having a predetermined wavelength is applied to a target 1 placed on a stage 2 through a mirror 5 and a lens 6. The stage 2 and the laser 4 are controlled by using a control device 3, and formed so that pulsed light can be applied to a desired portion of the target 1 by repeating output and non-output of laser light at predetermined intervals.

Figure 2B:
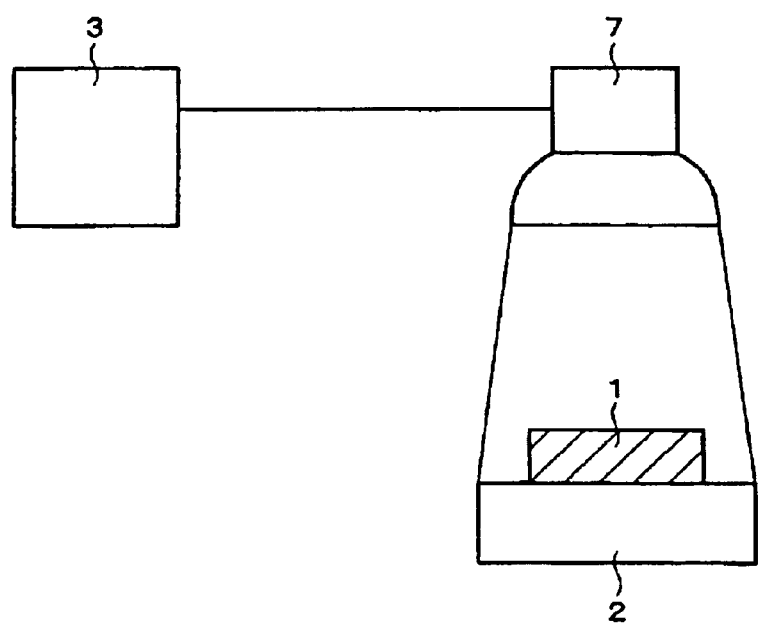

FIG. 2B schematically shows an example of a lamp irradiation device. In this lamp irradiation device, lamp light output from a lamp (xenon lamp, for example) 7 is applied to the target 1 placed on the stage 2. The lamp 4 is controlled by using the control device 3, and is formed to be able to apply pulsed lamp light to the target 1 by repeating output and non-output of lamp light at predetermined intervals.

The laser irradiation device and the lamp irradiation device shown in FIGS. 2A and 2B are also used in each embodiment described later and a modification of each embodiment.

Figure 3:
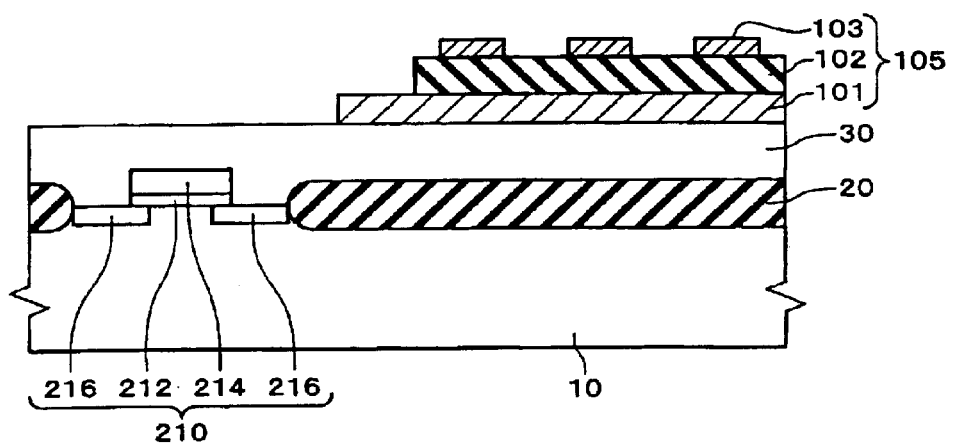
FIG. 3 schematically shows a manufacturing step of the ferroelectric memory according to the first embodiment of the present invention.

In the method of manufacturing the ferroelectric memory 1000 according to the present embodiment, the MOS transistor 210, the element isolation region 20, and the first interlayer dielectric 30 are formed over the semiconductor substrate 10 by using a conventional method of manufacturing a semiconductor device, as shown in FIG. 3. The lower electrode 101, the ferroelectric layer 102, and the upper electrode 103 are stacked over the first interlayer dielectric 30 to form the ferroelectric capacitor 105.

The lower electrode 101 may be formed of a noble metal such as Pt or Ir, or an oxide of the noble metal ($IrO_x$, for example). The lower electrode 101 may be a single layer film or a multi-layer film in which layers formed of a plurality of different materials are stacked. In the case where the ferroelectric layer 102 stacked on the lower electrode 101 is formed of strontium bismuth tantalate (SBT), the lower electrode 101 may be formed by forming a single-layer Pt film. In the case of forming the lower electrode 101 of a multi-layer film, a Ti film may be formed over the substrate 10 by using a sputtering method. A $TiO_x$ film may be formed by oxidizing the Ti film, and a Pt film may be formed over the TiO$_x$ film by using a sputtering method. Light can be efficiently utilized for improving the characteristics of the ferroelectric capacitor 105 in an irradiation step as described later by forming the lower electrode 101 using a metal such as Pt or Ir.

As a material for the ferroelectric layer 102, PZT (lead zirconate titanate), SBT (strontium bismuth tantalate), BIT (bismuth titanate), BLT (bismuth lanthanum), or the like may be used. The ferroelectric layer 102 is deposited by using a solution application method (including a sol-gel method and a metal organic decomposition (MOD) method), sputtering method, chemical vapor deposition (CVD) method (including a metal organic chemical vapor deposition (MOCVD) method), or the like.

As a material and a formation method of the upper electrode 103, the material and the formation method of the lower electrode 101 may be applied. The upper electrode 103 may be formed by using a material which can transmit or absorb laser light or lamp light, such as an oxide conductor. As examples of such a material used for the upper electrode 103, ITO (indium tin oxide: $In_2O_3$—$SnO_2$), SRO ($SrRuO_x$), LSCO ($La_xSr_{1-x}CoO_3$), YBCO ($YBa_2Cu_3O_7$), $IrO_x$, and the like can be given. Use of such a material enables light to be efficiently utilized for improving the characteristics of the ferroelectric capacitor 105 in an irradiation step as described later.

The lower electrode 101 and the upper electrode 103 may be processed into a stripe shape, in which a plurality of linear signal electrodes are arranged, by patterning the lower electrode 101 and the upper electrode 103 using a conventional method. As the patterning method, dry etching using high-density plasma such as inductively coupled plasma (ICP) may be applied.

Figure 4:
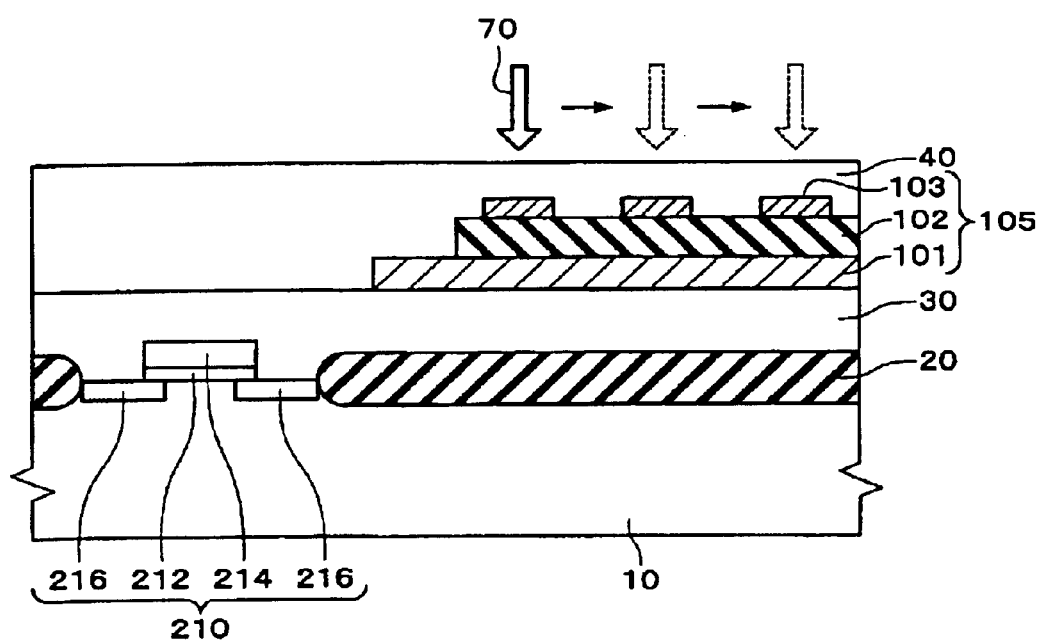
FIG. 4 schematically shows a manufacturing step of the ferroelectric memory according to the first embodiment of the present invention.

As shown in FIG. 4, the second interlayer dielectric 40 is formed to cover the ferroelectric capacitor 105. The second interlayer dielectric 40 may be formed of an oxide film such as $SiO_2$ by using a plasma CVD device. A large amount of hydrogen is generated when forming the second interlayer dielectric 40. Since hydrogen has a reduction on the oxide, hydrogen adversely affects the crystallization state of the ferroelectric layer 102 and the characteristics of the ferroelectric capacitor 105.

In the manufacturing method according to the present embodiment, pulsed laser light 70 is scanned over the ferroelectric layer 102 after forming the second interlayer dielectric 40, whereby the crystallization state is recovered by thermal energy of the laser light 70. This enables the crystallization state of the ferroelectric layer 102, which is one of the factors that determine the characteristics of the ferroelectric capacitor 105, to be maintained in an excellent state. Moreover, since the laser light 70 can be applied locally, the heat treatment can be performed for only a desired area without applying a thermal load to the peripheral members, such as the MOS transistor 210, which are easily affected by heating. Furthermore, since the heat treatment can be efficiently performed in a short time by using the pulsed laser light 70, a thermal load applied to other members can be significantly reduced.

Figure 5:
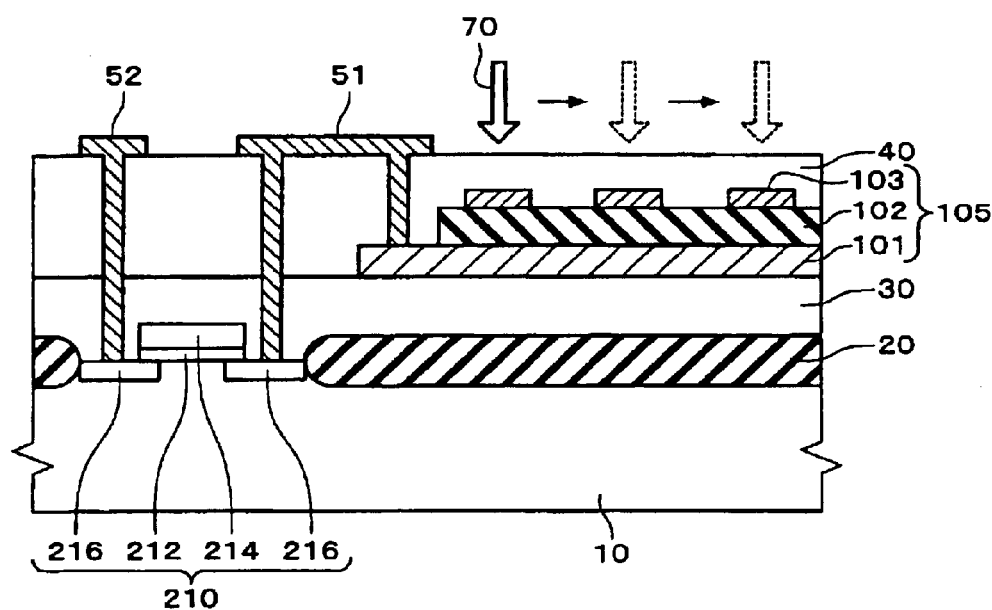
FIG. 5 schematically shows a manufacturing step of the ferroelectric memory according to the first embodiment of the present invention.

As shown in FIG. 5, the first interlayer dielectric 30 and the second interlayer dielectric 40 are etched by using a conventional etching method such as reactive ion etching (RIE) to form contact holes for the ferroelectric capacitor 105 and the MOS transistor 210. The interconnect layers 51 and 52 are formed of a metal such as Al in the contact holes. The ferroelectric capacitor 105 is electrically connected with the MOS transistor 210 through the interconnect layers 51 and 52. In the manufacturing method of the present embodiment, the heat treatment for recovering the crystallization state of the ferroelectric layer 102 may be performed by scanning with the laser light 70 even after forming the interconnect layers 51 and 52.

Since the heat treatment after forming a metal interconnect made of Al or the like induces deterioration of the metal interconnect, a heat treatment using an electric kiln or the like cannot be performed. However, the manufacturing method of the present embodiment enables a heat treatment to be performed in a short period of time without affecting the interconnect layers 51 and 52 while reducing the thermal load applied to other members by locally applying the pulsed laser light 70.

Figure 6:
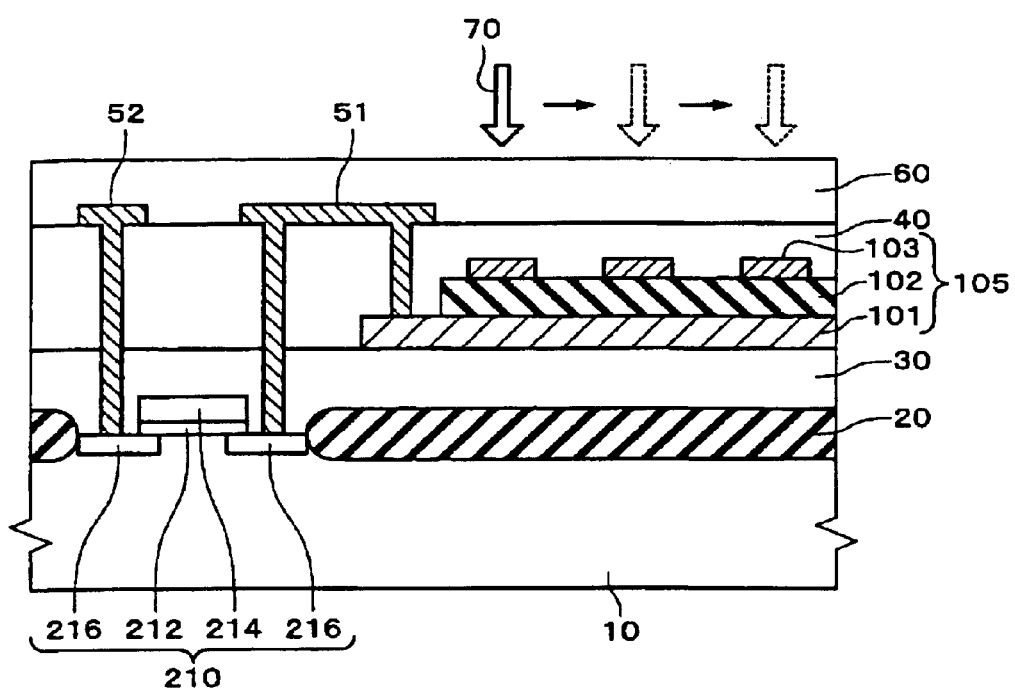
FIG. 6 schematically shows a manufacturing step of the ferroelectric memory according to the first embodiment of the present invention.

In the method of manufacturing the ferroelectric memory 1000 of the present embodiment, the protective film 60 is formed of SiN or the like so as to cover the interconnect layers 51 and 52, as shown in FIG. 6. A large amount of hydrogen is generated in the formation step of the protective layer 60 since a plasma CVD device is used, for example. Specifically, the crystallization state of the ferroelectric layer 102 of the ferroelectric capacitor 105 may be affected by the reduction of hydrogen. The crystallization state of the ferroelectric layer 102 can be improved by scanning the ferroelectric layer 102 with the pulsed laser light 70 after forming the protective film 60, whereby the characteristics of the ferroelectric capacitor can be improved in the same manner as described above. In this case, the heat treatment can be performed in a short period of time without applying a thermal load to the peripheral members.

According to the method of manufacturing the ferroelectric memory 1000 of the present embodiment, the manufacturing steps can be carried out while recovering the crystallization state of the ferroelectric layer 102, which determines the characteristics of the ferroelectric capacitor 105, while reducing the thermal load, whereby the ferroelectric memory 1000 having excellent characteristics can be obtained.

The present embodiment illustrates the case where the pulsed laser light is locally applied by using the laser irradiation device shown in FIG. 2A as an example. According to the following modification, the present invention may also be applied to the case of using the lamp irradiation device shown in FIG. 2B.

Modification

Figure 7:
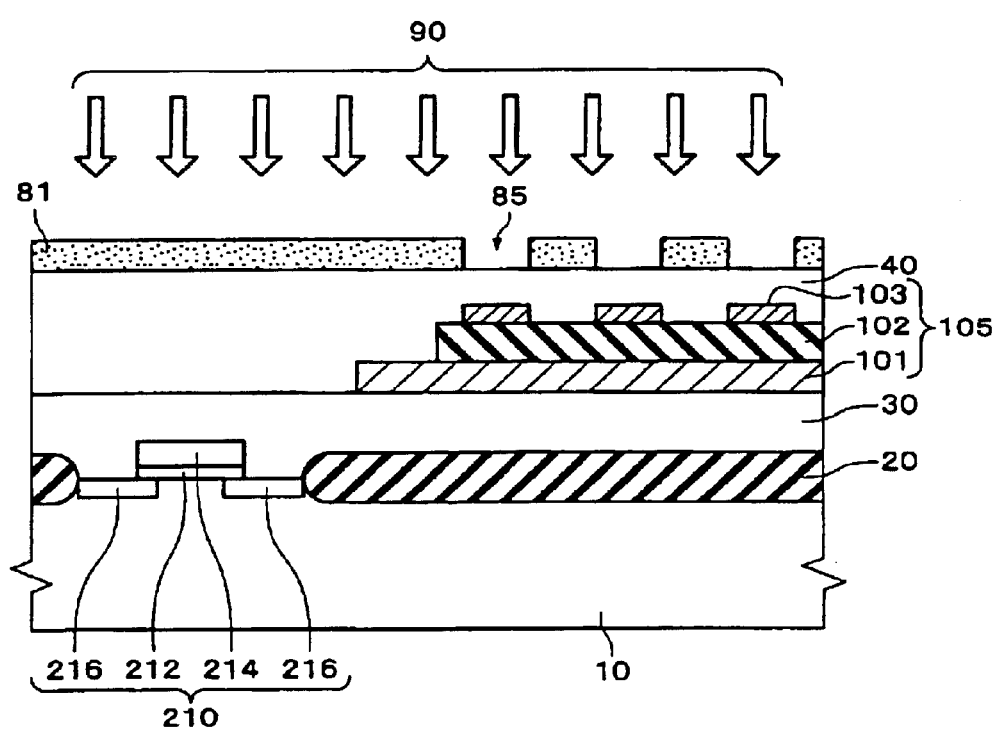
FIG. 7 schematically shows a modification of a manufacturing step of the ferroelectric memory according to the first embodiment of the present invention.
Figure 8:
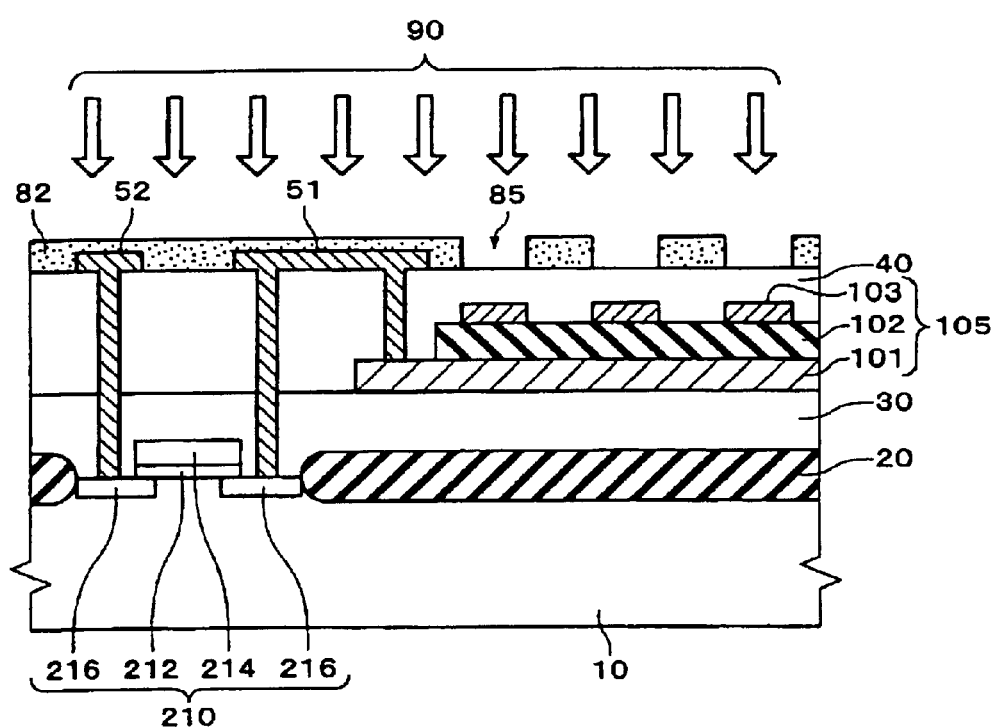
FIG. 8 schematically shows a modification of a manufacturing step of the ferroelectric memory according to the first embodiment of the present invention.
Figure 9:
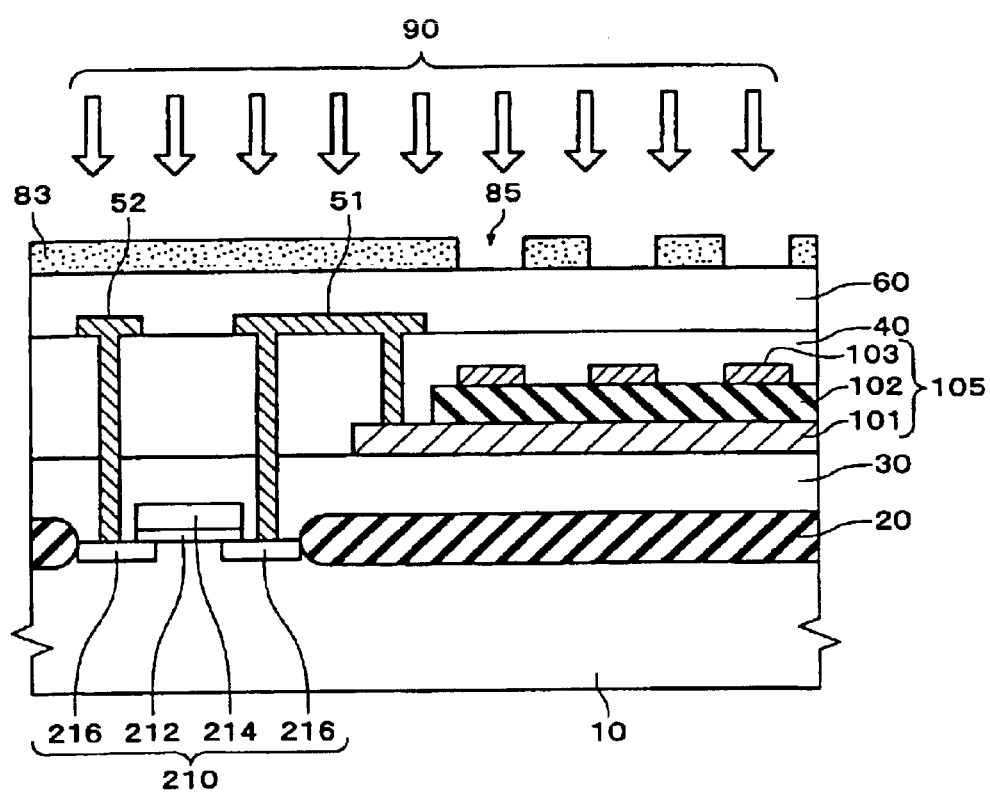
FIG. 9 schematically shows a modification of a manufacturing step of the ferroelectric memory according to the first embodiment of the present invention.

FIGS. 7 to 9 schematically show a modification of the method of manufacturing the ferroelectric memory 1000 according to the first embodiment of the present invention. In FIGS. 7 to 9, sections having substantially the same function as the sections shown in FIGS. 3 to 6 are indicated by the same symbols. Detailed description of these sections is omitted.

In the method of manufacturing the ferroelectric memory according to this modification, the ferroelectric capacitor 105 and the MOS transistor 210 are formed over the substrate 10 shown in FIG. 3 by using the above-described method.

As shown in FIG. 7, the second interlayer dielectric 40 is formed on the ferroelectric capacitor 105 by using a plasma CVD device, for example. A light blocking film 81 having an opening 85 over a predetermined area of the ferroelectric layer 102 included in the ferroelectric capacitor 105 is formed on the second interlayer dielectric 40.

In more detail, the area of the ferroelectric layer 102 disposed in the region in which the lower electrode 101 faces the upper electrode 103 (or region in which the lower electrode 101 intersects the upper electrode 103) substantially functions as the capacitor in the ferroelectric capacitor 105. In this modification, the opening 85 is formed over the region in which the lower electrode 101 faces the upper electrode 103. It suffices that the opening 85 be formed over the ferroelectric layer 102 at least in the area which substantially functions as the capacitor. The opening 85 may be formed over the entire ferroelectric layer 102. The opening 85 may also be formed in light blocking films 82 and 83 described later in the same manner as described above.

The light blocking film 81 may be formed of a metal such as Al, Au, Ag, Cu, Pt, or Ir, or an insulator by using a sputtering method, for example. The light blocking film 81 is formed in order to prevent light from being applied to the lower layer by reflecting or absorbing the light. The light blocking film 81 may be removed by etching or the like after completing the application of light. This also applies to the light blocking films 82 and 83 described later. This modification is described on the assumption that the light blocking films 81 to 83 are removed after completing the light application step.

In this modification, when pulsed lamp light 90 is applied over the entire surface by using the lamp irradiation device shown in FIG. 2B, for example, thermal energy is applied to the ferroelectric layer 102 by the lamp light 90 which passes through the opening 85, whereby a heat treatment can be performed. Specifically, the crystallization state of the ferroelectric layer 102 affected by hydrogen generated when forming the second interlayer dielectric 40 is recovered in the area in which the ferroelectric layer 102 functions as the capacitor, whereby the characteristics of the ferroelectric capacitor 105 can be improved.

In this modification, after forming the interconnect layers 51 and 52, the light blocking film 82 is formed of an insulator or the like so as to cover the interconnect layers 51 and 52, as shown in FIG. 8. The opening 85 is also formed in the light blocking film 82 over the predetermined area of the ferroelectric layer 102. In this case, the crystallization state of the predetermined area of the ferroelectric layer 102 is recovered by applying the pulsed lamp light from the top of the light blocking film 82, whereby the characteristics of the ferroelectric capacitor can be improved.

In this modification, after forming the protective film 60 so as to cover the interconnect layers 51 and 52, the light blocking film 83 having the opening 85 over the predetermined area of the ferroelectric layer 102 may be formed, as shown in FIG. 9. In this case, the crystallization state of the predetermined area of the ferroelectric layer 102, which is affected by hydrogen generated when forming the protective film 83, is recovered by applying the pulsed lamp light from the top of the light blocking film 83, whereby the characteristics of the ferroelectric capacitor can be improved.

As described above, in this modification, the manufacturing steps can be carried out while recovering the crystallization state of the ferroelectric layer 102 and effectively reducing the thermal load applied to the peripheral members by forming the light blocking films 81 to 83 having the opening 85, when applying light. Moreover, the heat treatment can be performed while reducing the thermal load applied to the peripheral members even in the case of using a device which applies light over the entire surface of the object, such as a lamp irradiation device. Therefore, in the manufacturing method of this modification, the manufacturing steps are also carried out while improving the characteristics of the ferroelectric capacitor, whereby the ferroelectric memory 1000 having excellent characteristics can be obtained. The method described in this modification may also be applied to the case of using a laser irradiation device.

Second Embodiment

Figure 10:
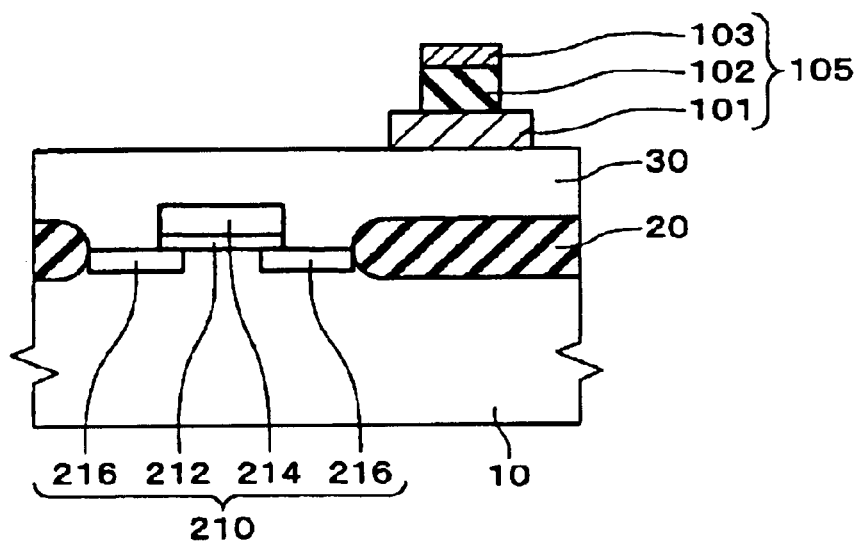
FIG. 10 schematically shows a manufacturing step of a ferroelectric memory according to a second embodiment of the present invention.
Figure 11A:
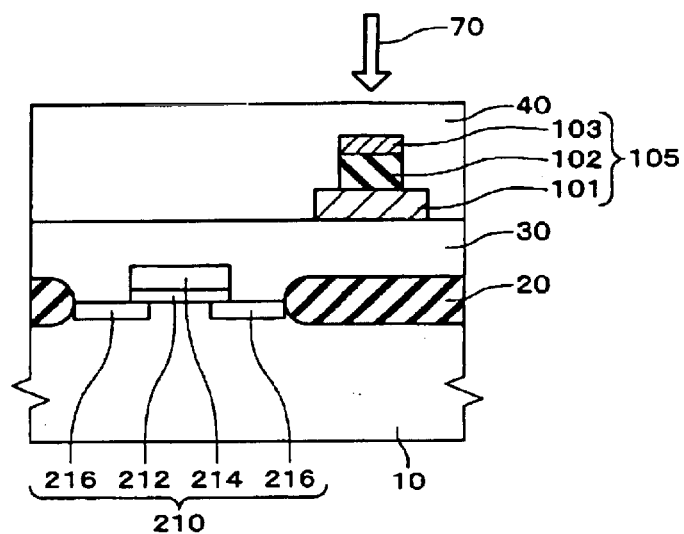
FIG. 11A schematically shows a manufacturing step of the ferroelectric memory according to the second embodiment of the present invention, and FIG. 11B schematically shows a manufacturing step of the ferroelectric memory according to the second embodiment of the present invention.
Figure 11B:
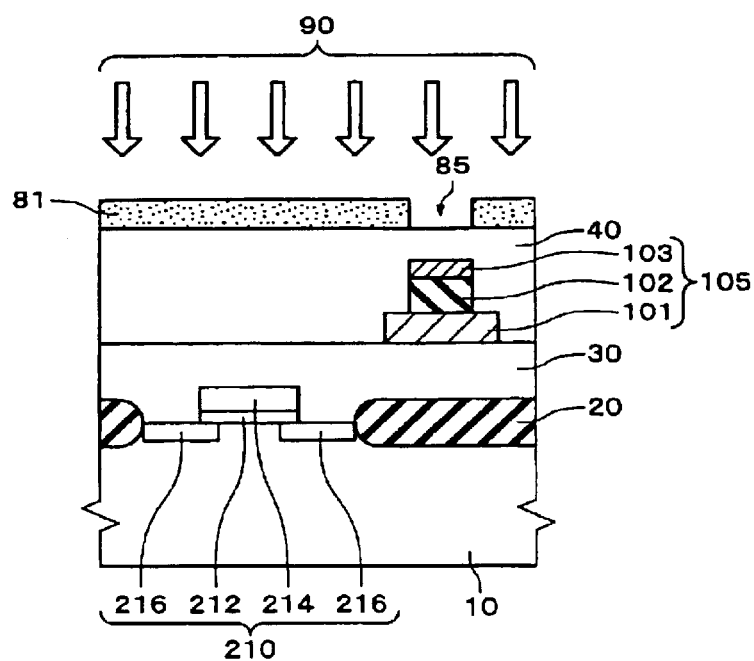
Figure 12:
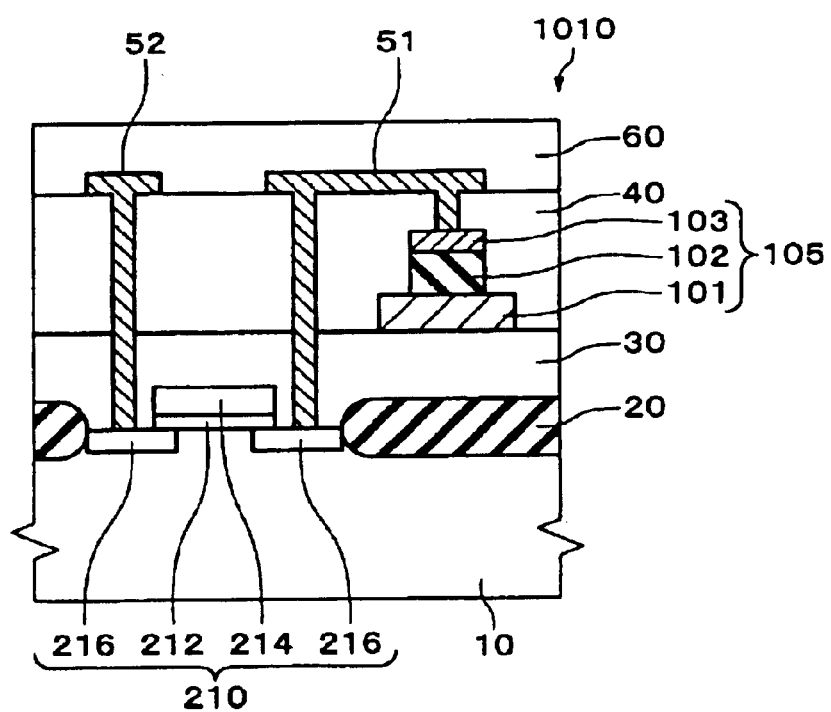
FIG. 12 schematically shows a manufacturing step of the ferroelectric memory according to the second embodiment of the present invention.

FIGS. 10 to 12 schematically show a method of manufacturing a ferroelectric memory according to a second embodiment of the present invention. In FIGS. 10 to 12, sections having substantially the same function as the sections described in the above embodiment are indicated by the same symbols. Detailed description of these sections is omitted.

The present embodiment illustrates the case of manufacturing a 1T1C-type ferroelectric memory in which the ferroelectric capacitor 105 and the MOS transistor 210 for driving the ferroelectric capacitor 105 make up one memory cell.

In the present embodiment, the MOS transistor 210, the first interlayer dielectric 30, and the ferroelectric capacitor 105 are formed over the substrate 10 in that order by using the same method as in the above embodiment, as shown in FIG. 10. The MOS transistor 210 is insulated from the MOS transistors 210 of other memory cells by the element isolation region 20.

As shown in FIG. 11A, the second interlayer dielectric 40 is formed on the ferroelectric capacitor 105. The pulsed laser light 70 is then locally applied to the ferroelectric layer 102. This enables the crystallization state of the ferroelectric layer 102, which is affected by hydrogen generated when forming the second interlayer dielectric 40, to be recovered.

A lamp irradiation device may be used instead of the laser irradiation device. In this case, the light blocking film 81 having the opening 85 is formed on the second interlayer dielectric 40, as shown in FIG. 11B. The opening 85 is formed over the ferroelectric layer 102. The crystallization state of the ferroelectric layer 102 can be recovered by applying the pulsed lamp light 90 over the entire surface from the top of the light blocking film 81. The method using the light blocking film 81 shown in FIG. 11B may also be applied to the case of applying the laser light 70.

After the step shown in FIG. 11A or 11B, contact holes are formed by etching the second interlayer dielectric 40 as shown in FIG. 12. The ferroelectric capacitor 105 is electrically connected with the MOS transistor 210 by forming the interconnect layers 51 and 52. The protective layer 60 is then formed to cover the interconnect layers 51 and 52 to obtain a ferroelectric memory 1010.

As described above, in the manufacturing method according to the present embodiment, the manufacturing steps can be carried out while improving characteristics of the ferroelectric capacitor 105 by recovering the crystallization state of the ferroelectric layer 105 which is affected in the formation step of the second interlayer dielectric 40 by performing the heat treatment by applying the pulsed laser light 70 or the lamp light 90. Moreover, since the laser light 70 or the lamp light 90 can be applied to the ferroelectric layer 102 so that thermal energy is not applied to the peripheral members, the peripheral members do not deteriorate due to thermal load. Therefore, the manufacturing method according to the present embodiment enables the ferroelectric memory 1010 having excellent characteristics to be obtained.

Modification

Figure 13:
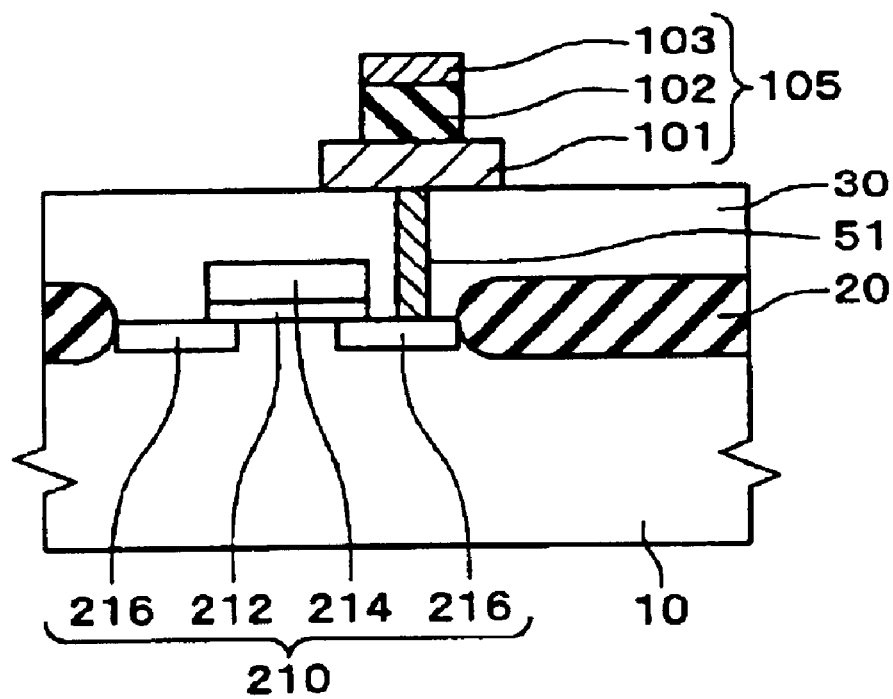
FIG. 13 schematically shows a modification of a manufacturing step of the ferroelectric memory according to the second embodiment of the present invention.
Figure 14A:
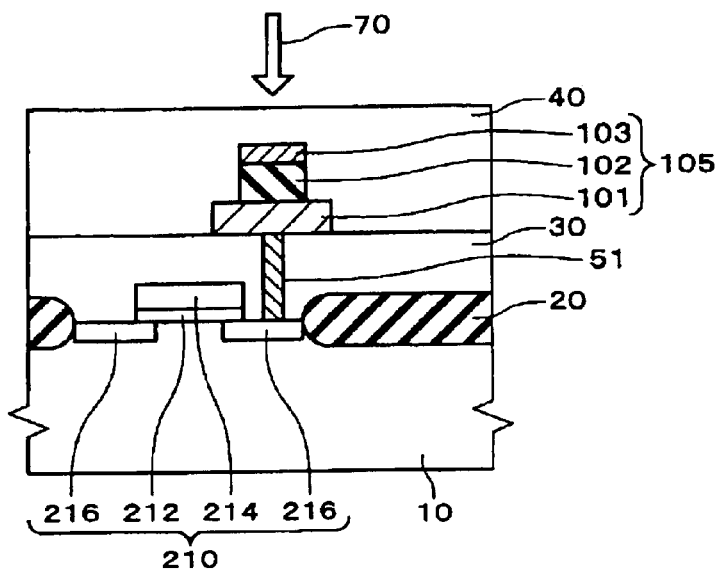
FIG. 14A schematically shows a modification of a manufacturing step of the ferroelectric memory according to the second embodiment of the present invention, and FIG. 14B schematically shows a modification of a manufacturing step of the ferroelectric memory according to the second embodiment of the present invention.
Figure 14B:
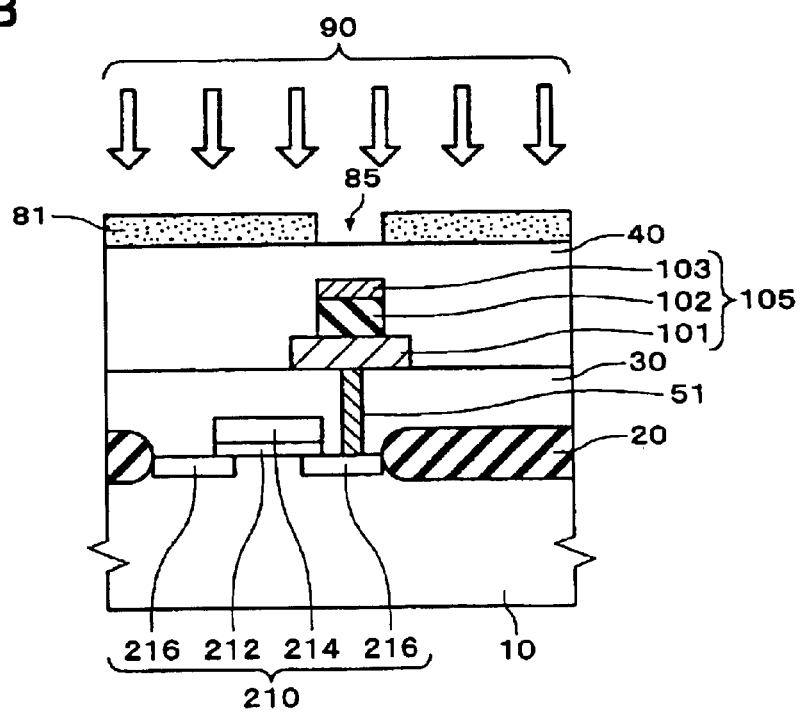
Figure 15:
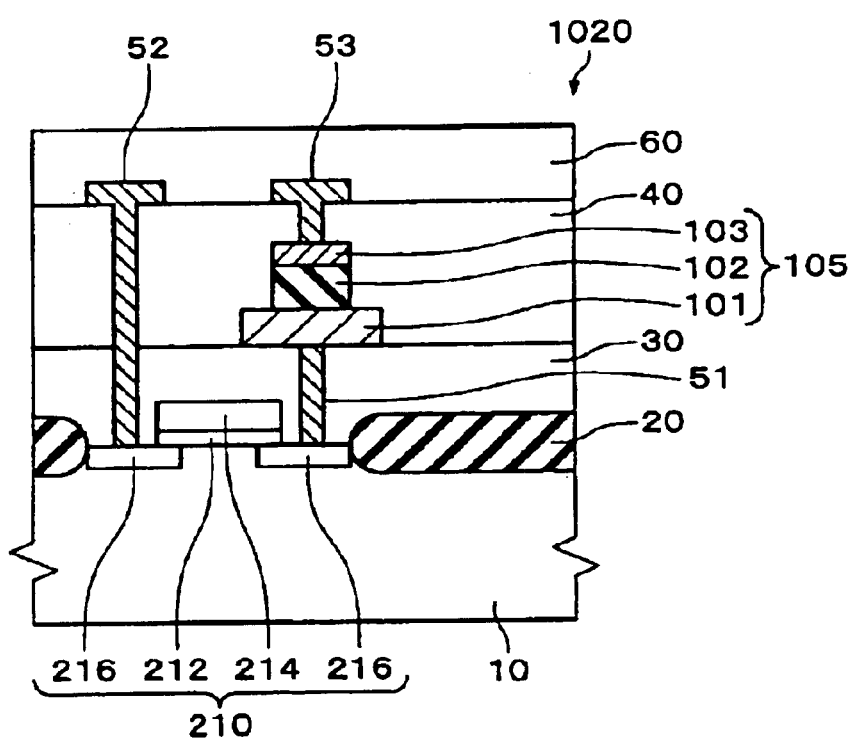
FIG. 15 schematically shows a modification of a manufacturing step of the ferroelectric memory according to the second embodiment of the present invention.

FIGS. 13 to 15 schematically show a modification of the manufacturing method of the second embodiment of the present invention. In FIGS. 13 to 15, sections having substantially the same function as the sections shown in FIGS. 10 to 12 are indicated by the same symbols. Detailed description of these sections is omitted.

This modification illustrates the case where the ferroelectric capacitor 105 is connected with the MOS transistor 210 through the interconnect layer 51 before the formation step of the second interlayer dielectric 40.

As shown in FIG. 13, the MOS transistor 210 is formed on the substrate 10. The first interlayer dielectric 30 is formed on the MOS transistor 210. A contact hole is formed in the first interlayer dielectric 30, and the interconnect layer 51 is formed in the contact hole. The lower electrode 101, the ferroelectric layer 102, and the upper electrode 103 are stacked on the interconnect layer 51 in that order to form the ferroelectric capacitor 105. This allows the ferroelectric capacitor 105 to be electrically connected with the MOS transistor 210 through the interconnect layer 51 which functions as a plug electrode.

In this modification, the second interlayer dielectric 40 is formed on the ferroelectric capacitor 105, and the pulsed laser light 70 is applied to the ferroelectric layer 102 from the top of the second interlayer dielectric 40 as shown in FIG. 14A, whereby the crystallization state of the ferroelectric layer 102 which is affected by hydrogen generated during the formation step of the second interlayer dielectric 40 can be recovered. As shown in FIG. 14B, the same effect can be obtained by forming the light blocking film 81 having the opening 85 over the ferroelectric layer 102 included in the ferroelectric capacitor 105 on the second interlayer dielectric 40, and applying the pulsed lamp light 90 to the ferroelectric layer 102 from the top of the light blocking film 81.

Contact holes are then formed in the second interlayer dielectric 40, and the interconnect layers 52 and 53 for connecting the ferroelectric capacitor 105 and the MOS transistor 210 with the outside are formed in the contact holes to obtain a ferroelectric memory 1020.

Therefore, in the manufacturing method according to this modification, the manufacturing steps can be carried out while improving the characteristics of the ferroelectric capacitor 105 by performing the heat treatment for recovering the crystallization state of the ferroelectric layer 105, which is affected during the formation step of the second interlayer dielectric 40, by applying the pulsed laser light 70 or lamp light 90. Moreover, since the laser light 70 or the lamp light 90 is applied to the ferroelectric layer 102 so that thermal energy is not applied to the peripheral members, the peripheral members do not deteriorate due to thermal load. Therefore, the manufacturing method according to this modification enables the ferroelectric memory 1020 having excellent characteristics to be obtained.

Third Embodiment

Figure 16A:
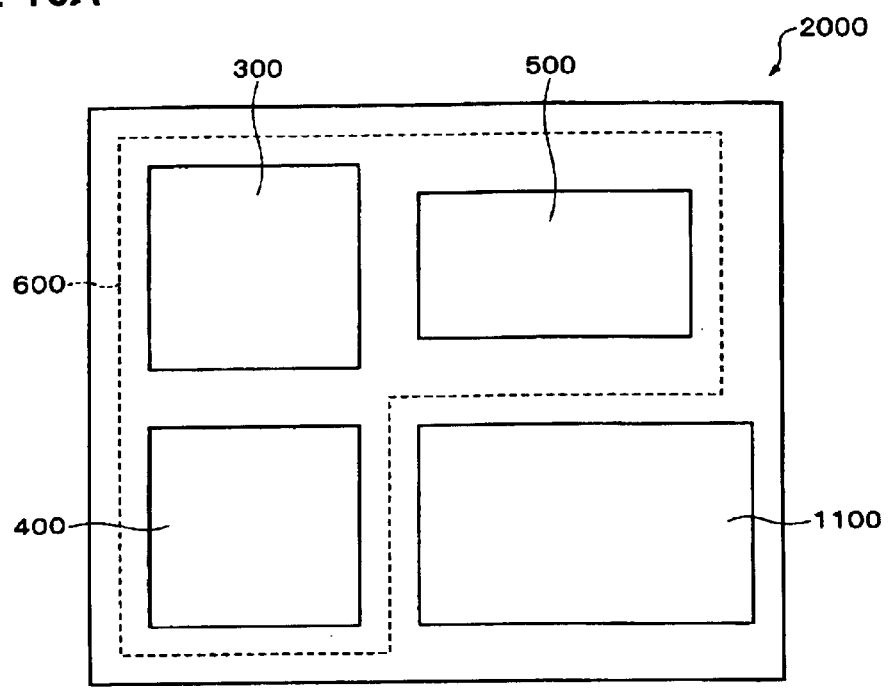
FIG. 16A schematically shows a semiconductor device according to a third embodiment of the present invention.

FIG. 16A schematically shows a semiconductor device 2000 according to a third embodiment of the present invention. In the semiconductor device 2000, a memory cell region 1100 including ferroelectric capacitors and another circuit region 600 including semiconductor circuits 300, 400, and 500 are formed over a single substrate. The memory cell region 1100 is made up of the memory cells of the ferroelectric memory described in the first and second embodiments and the modifications of the first and second embodiments, a memory cell array, and the like. The semiconductor circuits 300, 400, and 500 are made up of a driver circuit and an operation circuit for the memory cell region 1100, other memory devices, and the like.

In the semiconductor device 2000 having such a structure, in the case of forming the circuit region 600 over the substrate before forming the memory cell region 1100, if a high-temperature heat treatment is performed for recovering the characteristics of the ferroelectric capacitor, the characteristics of the semiconductor circuits 300, 400, and 500 included in the circuit region 500 deteriorate.

Figure 16B:
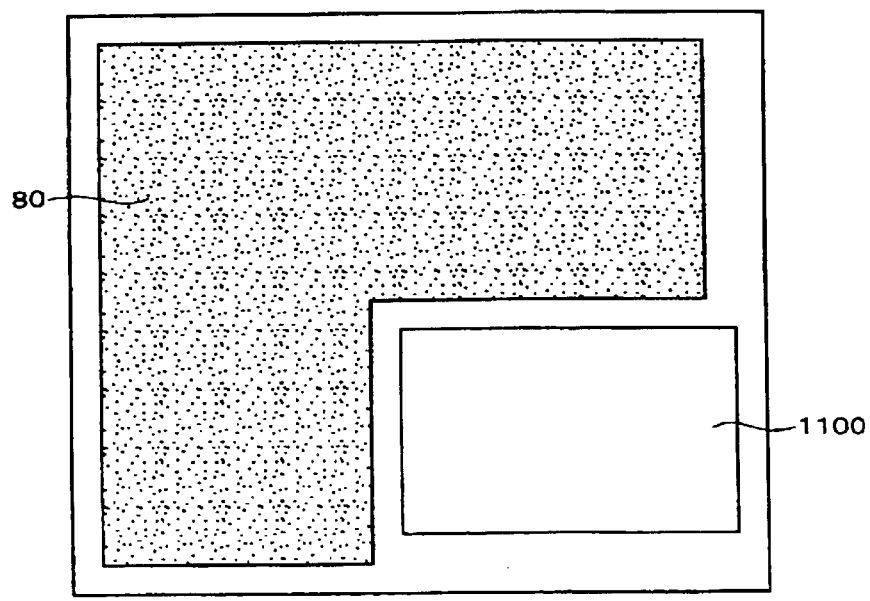
FIG. 16B is illustrative of a state during a manufacturing step of the semiconductor device according to the third embodiment of the present invention.

In the semiconductor device 2000 according to the present embodiment, the memory cell region 1100 is formed over the substrate after forming the circuit region 600 over the substrate and forming a light blocking film 80 formed of a metal over the circuit region 600, as shown in FIG. 16B. The light blocking film 80 may be formed during the formation step of the memory cell region 1100. It suffices that the light blocking film 80 be formed before applying pulsed laser light or lamp light to the ferroelectric capacitor. The memory cells of the ferroelectric memory and the memory cell array included in the memory cell region 1100 and the like may be formed by using the manufacturing method described in the above embodiment.

Specifically, pulsed laser light or lamp light applied for improving the characteristics of the ferroelectric capacitor does not affect the circuit region 600 under the light blocking film 80 due to the presence of the light blocking film 80. Therefore, in the method of manufacturing the semiconductor device 2000 according to the present embodiment, since the thermal load applied to the circuit region 600 other than the memory cell region 1100 can be reduced by forming the light blocking film 80, the degrees of freedom of the manufacturing process are increased. Moreover, in this manufacturing method, since the amount of thermal load applied to the circuit region 600 is small, metal interconnects in the circuit do not deteriorate due to heat, whereby the characteristics of the semiconductor circuits 300, 400, and 500 can be secured and the yield of the semiconductor device 2000 can be increased.

The preferred embodiments of the present invention are described above. However, the present invention is not limited to these embodiments. Various modifications and variations are possible within the scope of the present invention.

What is claimed is:

1. A method of manufacturing a ferroelectric memory comprising:

applying pulsed laser light or lamp light to a ferroelectric capacitor from above the ferroelectric capacitor in a state in which at least the ferroelectric capacitor is formed over a substrate.

2. The method of manufacturing a ferroelectric memory as defined in claim 1, applying the pulsed laser light or lamp light to a ferroelectric layer included in the ferroelectric capacitor to recover a characteristic of the ferroelectric capacitor.

3. The method of manufacturing a ferroelectric memory as defined in claim 1, comprising:

applying the pulsed laser light or lamp light after forming an interlayer dielectric over the ferroelectric capacitor.

4. The method of manufacturing a ferroelectric memory as defined in claim 1, comprising:

applying the pulsed laser light or lamp light after forming a metal interconnect for connecting the ferroelectric capacitor with another section.

5. The method of manufacturing a ferroelectric memory as defined in claim 1, comprising:

applying the pulsed laser light or lamp light after forming a protective film which covers a metal interconnect for connecting the ferroelectric capacitor with another section.

6. The method of manufacturing a ferroelectric memory as defined in claim 1, further comprising:

forming an upper electrode included in the ferroelectric capacitor by using a material which transmits or absorbs light.

7. The method of manufacturing a ferroelectric memory as defined in claim 1, further comprising:

forming a lower electrode included in the ferroelectric capacitor by using a material which reflects light.

8. A ferroelectric memory manufactured by using the manufacturing method as defined in any claim 1.

9. A ferroelectric memory manufactured by using the manufacturing method as defined in claim 1, the ferroelectric memory comprising:

a ferroelectric capacitor which includes:

stripe-shaped upper electrodes and stripe-shaped lower electrodes, the upper and lower electrodes being formed to intersect each other over a substrate; and a ferroelectric layer formed between the upper electrodes and the lower electrodes and disposed in at least one of the intersecting regions of the upper electrodes and the lower electrodes.

10. A method of manufacturing a semiconductor device which includes a memory cell region and another circuit region, the memory cell region having a ferroelectric capacitor, the method comprising:

forming the memory cell region in a predetermined region over a substrate; and forming the circuit region over the substrate in a region differing from the memory cell region, and wherein the memory cell region is formed by using the manufacturing method as defined in claim 1 after forming at least the light blocking film.

11. A semiconductor device manufactured by using the method as defined in claim 10.

12. A method of manufacturing a ferroelectric memory comprising:

forming a light blocking film having an opening over at least a predetermined area of a ferroelectric layer included in a ferroelectric capacitor in a state in which at least the ferroelectric capacitor is formed over a substrate; and applying pulsed laser light or lamp light to the ferroelectric capacitor from above the ferroelectric capacitor.

* * * * *